(12) United States Patent
Zhang et al.

(10) Patent No.: US 8,736,302 B2
(45) Date of Patent: May 27, 2014

(54) RECONFIGURABLE INTEGRATED CIRCUIT

(75) Inventors: Xu Zhang, Tianjin (CN); Chad J. Lerma, Austin, TX (US); Kai Liu, Tianjin (CN); Sian Lu, Tianjin (CN); Hao Wang, Tianjin (CN); Shayan Zhang, Tianjin (CN); Wanggen Zhang, Suzhou (CN)

(73) Assignee: Freescale Semiconductor, Inc., Austin, TX (US)

( * ) Notice: Subject to any disclaimer, the term of this patent is extended or adjusted under 35 U.S.C. 154(b) by 36 days.

(21) Appl. No.: 13/609,283

(22) Filed: Sep. 11, 2012

(65) Prior Publication Data
US 2013/0300497 A1 Nov. 14, 2013

(30) Foreign Application Priority Data

May 9, 2012 (CN) .......................... 2012 1 0141356

(51) Int. Cl.
*H03K 19/173* (2006.01)
*H03K 19/00* (2006.01)
*H01L 25/00* (2006.01)

(52) U.S. Cl.
USPC .............................. 326/38; 326/101; 327/564

(58) Field of Classification Search
USPC ................ 326/37–41, 47, 101; 257/786, 678; 324/750.3
See application file for complete search history.

(56) References Cited

U.S. PATENT DOCUMENTS

| | | | |
|---|---|---|---|
| 6,114,878 A * | 9/2000 | Loughmiller et al. | ........ 326/101 |
| 6,621,289 B1 * | 9/2003 | Voogel | ...................... 324/762.03 |
| 6,633,183 B2 * | 10/2003 | Duesman | ......................... 326/47 |
| 6,693,456 B2 * | 2/2004 | Wong | ............................... 326/41 |
| 6,825,683 B1 | 11/2004 | Berndt | |
| 6,944,810 B2 * | 9/2005 | Oberle et al. | ................. 714/733 |
| 6,954,080 B2 | 10/2005 | Whetsel | |
| 6,979,905 B2 * | 12/2005 | Nishida et al. | ................ 257/777 |
| 7,138,814 B2 | 11/2006 | Gabara | |
| 7,230,447 B2 * | 6/2007 | Whetsel | .......................... 326/16 |
| 7,443,039 B2 | 10/2008 | Zhao | |
| 7,821,281 B2 | 10/2010 | Chen | |
| 7,948,243 B2 | 5/2011 | DeJong | |
| 7,960,189 B2 | 6/2011 | Cauvet | |
| 7,990,163 B2 * | 8/2011 | Fujiwara et al. | ........... 324/750.3 |
| 2002/0184583 A1 * | 12/2002 | Hikone et al. | ................ 714/726 |
| 2006/0261854 A1 * | 11/2006 | Terui | .............................. 326/101 |
| 2011/0156033 A1 | 6/2011 | Bintang | |

* cited by examiner

*Primary Examiner* — Alexander H Taningco
*Assistant Examiner* — Dylan White
(74) *Attorney, Agent, or Firm* — Charles Bergere

(57) ABSTRACT

A reconfigurable integrated circuit (IC) has IC interface terminals including circuit input terminals and circuit output terminals. A bypass controller and bypass circuitry are coupled to each other, and to at least one of the circuit input terminals and at least one of the circuit output terminals. A processing circuit has multiple circuit modules coupled to the bypass circuitry. The processing circuit is coupled to at least one of the circuit input terminals and at least one of the circuit output terminals. In operation the bypass controller controls the bypass circuitry to selectively couple at least one pair of the IC interface terminals together, the pair including one of the circuit input terminals and one of the circuit output terminals. When the pair of IC interface terminals are coupled together, at least one of the circuit modules is selectively de-coupled from the pair of the IC terminals.

18 Claims, 8 Drawing Sheets

# RECONFIGURABLE INTEGRATED CIRCUIT

BACKGROUND OF THE INVENTION

The present invention relates to integrated circuits and, more particularly, to a reconfigurable integrated circuit having increased accessibility of terminals of a die embedded with other dies that form a semiconductor circuit package.

Semiconductor device packages are being assembled with an increased functionality to package pin count (external terminal count). This is partly because of improved silicon die fabrication techniques that allow die size reductions and thus two or more dice can be mounted on a single substrate and encapsulated to form a single, relatively small packaged semiconductor device. However, due to the limited package external terminal count, accessibility for adequately testing each die is limited. Furthermore, the functionality of the package may also be restricted by the limited accessibility of specific terminals of one or more of the packaged dice. Thus, it would be advantageous to be able to more readily access die bonding pads of the packaged dice.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
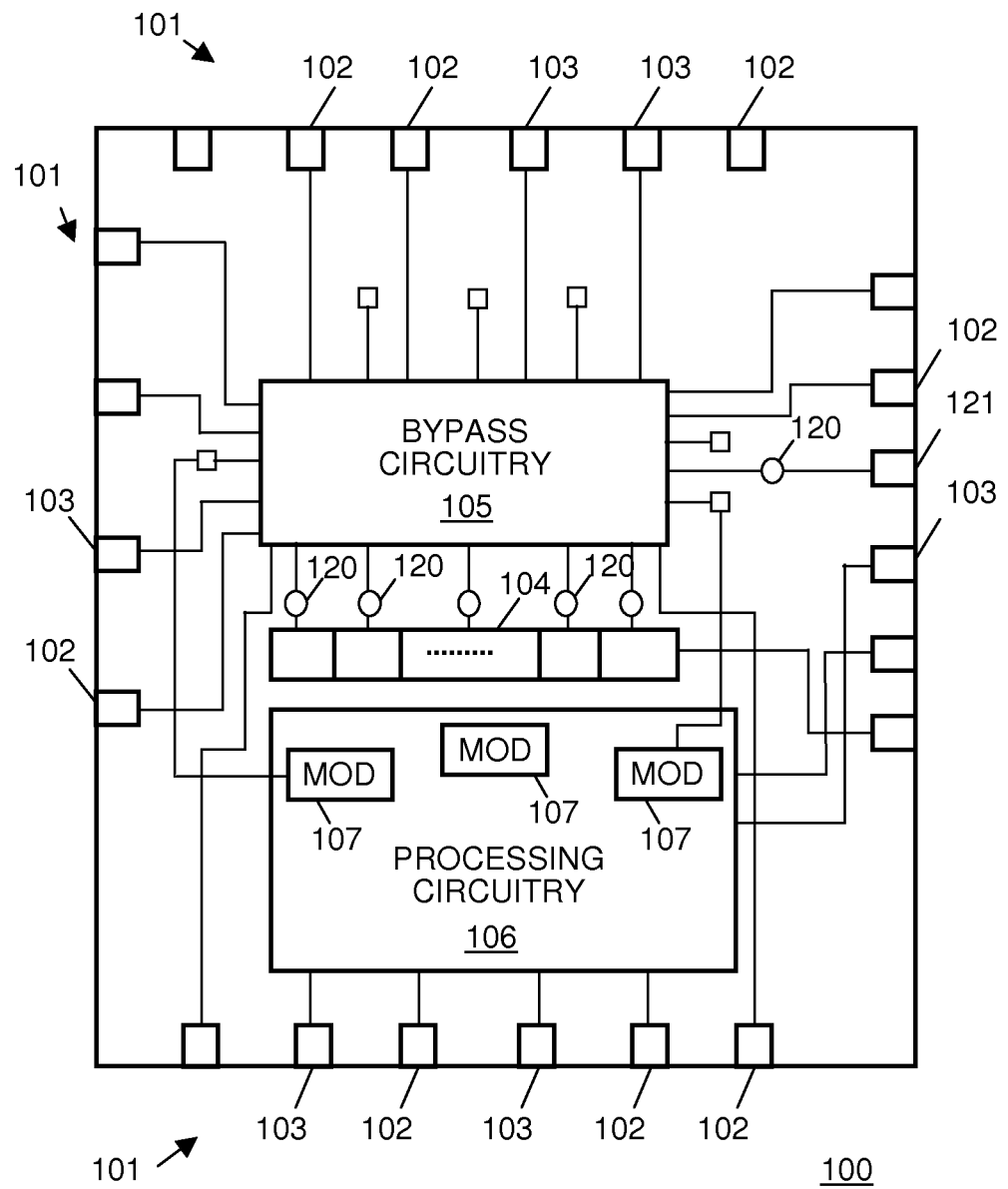
FIG. 1 is a schematic circuit diagram of a reconfigurable integrated circuit in accordance with a preferred embodiment of the present invention.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element proceeded by "comprises . . . a" does not, without more constraints, preclude the existence of additional identical elements that comprises the element.

In one embodiment, the present invention provides a reconfigurable integrated circuit with integrated circuit interface terminals comprising circuit input terminals and circuit output terminals. There is a bypass control node and bypass circuitry is coupled to the bypass control node, at least one of the circuit input terminals and at least one of the circuit output terminals. There is processing circuitry comprising a plurality circuit modules coupled to the bypass circuitry, the processing circuitry being coupled to at least one of the circuit input terminals and at least one of the circuit output terminals. In operation, a signal at the bypass control node controls the bypass circuitry to selectively couple at least one pair of the integrated circuit interface terminals together, the pair comprising one of the circuit input terminals and one of the circuit output terminals.

In another embodiment the present invention provides a semiconductor package comprising a substrate and external package terminals supported by the substrate, the terminals comprising package input terminals and package output terminals. There is a first semiconductor die mounted on the substrate, the first semiconductor die having first die external terminals. There is a second semiconductor die mounted on the substrate, wherein the second semiconductor die is a reconfigurable integrated circuit with integrated circuit interface terminals comprising circuit input terminals and circuit output terminals. There is a bypass controller and bypass circuitry is coupled to the bypass controller, at least one of the circuit input terminals and at least one of the circuit output terminals. There is processing circuitry comprising a plurality circuit modules coupled to the bypass circuitry, the processing circuitry being coupled to at least one of the circuit input terminals and at least one of the circuit output terminals. In operation the bypass controller controls the bypass circuitry to selectively couple at least one pair of the integrated circuit interface terminals together, the pair comprising one of the circuit input terminals and one of the circuit output terminals. Electrical connections provide for selectively connecting the external package terminals to the first die external terminals and the integrated circuit interface terminals. The electrical connections also provide for selectively connecting the first die external terminals to the integrated circuit interface terminals.

In yet a further embodiment the present invention provides a method for reconfiguring a reconfigurable integrated circuit with integrated circuit interface terminals comprising circuit input terminals and circuit output terminals. The reconfigurable integrated circuit has at least one programmable register, bypass circuitry coupled to the programmable register, at least one of the circuit input terminals and at least one of the circuit output terminals, processing circuitry comprising a plurality circuit modules coupled to the bypass circuitry, the processing circuitry being coupled to at least one of the circuit input terminals and at least one of the circuit output terminals. The method includes programming the programmable register into a first state to provide a first state signal to the bypass circuitry. The method then performs selectively coupling at least one pair of the integrated circuit interface terminals together through the bypass circuitry in response to the first state signal, the integrated circuit interface terminals pair comprising one of the circuit input terminals and one of the circuit output terminals. The method then performs programming the programmable register into a second state to provide a second state signal to the bypass circuitry The method then provides for selectively coupling at least one of the integrated circuit interface terminals to at least one of the circuit modules through the bypass circuitry in response to the second state signal.

Referring to FIG. 1, a schematic circuit diagram of a reconfigurable integrated circuit 100 in accordance with a preferred embodiment of the present invention is shown. The reconfigurable integrated circuit 100 has integrated circuit interface terminals 101 comprising circuit input terminals 102 and circuit output terminals 103 coupled to a bypass controller 104, in the form of a programmable register, with output to one or more bypass control nodes 120. Alternatively, or in addition to the bypass controller 104, the bypass control nodes 120 may be coupled to a bypass control node 121 provided by one or more available input terminals. The reconfigurable integrated circuit 100 also has bypass circuitry 105 coupled to the bypass control node or nodes 120, the circuit input terminals 102, and the circuit output terminals 103. There is also processing circuitry 106 comprising a plurality circuit modules 107 coupled to the bypass circuitry 105. The processing circuitry is also coupled to the circuit input terminals 102 and the circuit output terminals 103.

Figure 2:
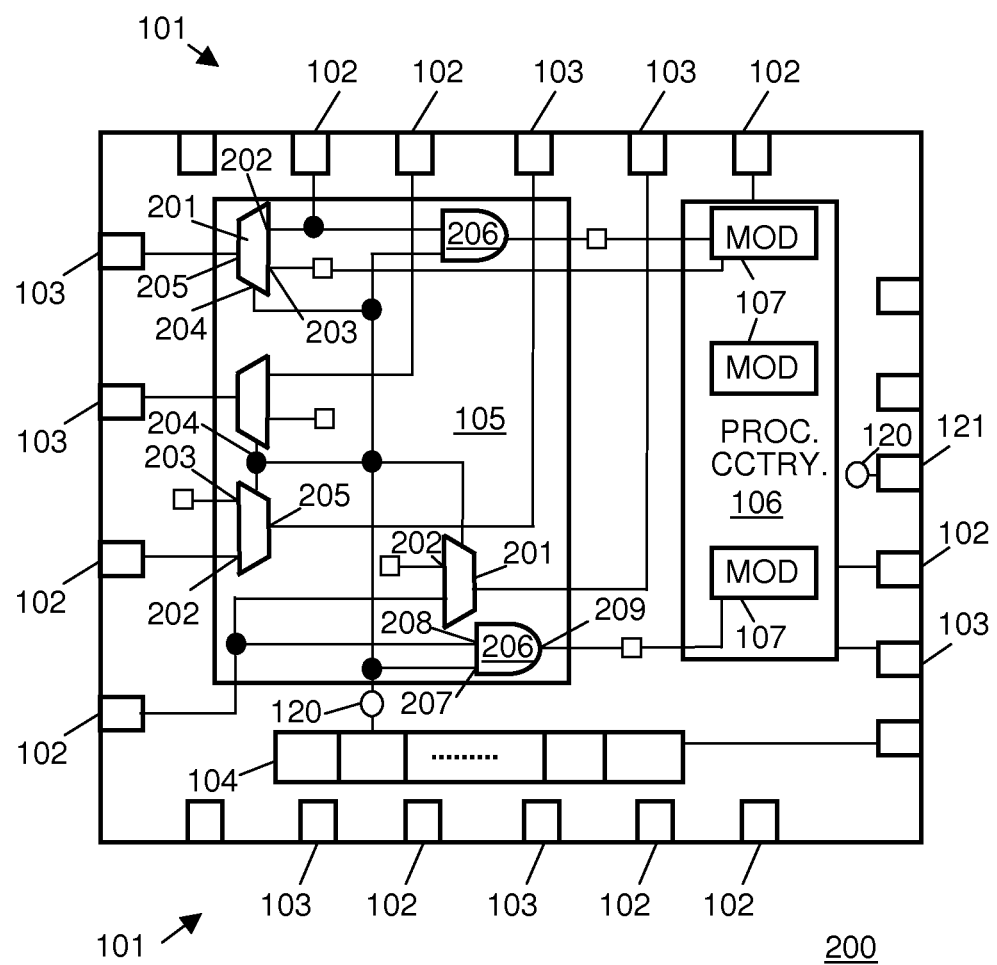
FIG. 2 is a schematic circuit diagram of a reconfigurable integrated circuit with bypass circuitry configured in accordance with a second preferred embodiment of the present invention.

Referring to FIG. 2 there is illustrated a schematic circuit diagram of a reconfigurable integrated circuit 200 with bypass circuitry 105 configured in accordance with a second preferred embodiment of the present invention. The integrated circuit 200 is a more detailed illustration of one embodiment of the integrated circuit 100. As will be apparent to a person skilled in the art, the processing circuitry 106 is illustrated in a different position purely for ease of illustration but could be located anywhere, in various positions or orientations based on layout design and package parameters. As shown, the bypass circuitry comprises multiplexers 201 with a bypass input 202, a processing circuitry input 203, and a control input 204 coupled to the bypass controller 104 and a multiplexer output 205. In operation, the bypass controller 104 provides a signal Si at the bypass control node 120 to the control input 204 to selectively couple each one of the multiplexer outputs 205 to either their corresponding bypass input 202 or the processing circuitry input 203.

As shown, each bypass input 202 is coupled to one of the circuit input terminals 102, each multiplexer output 205 is coupled to one of the circuit output terminals 103 and the processing circuitry input 203 is coupled to the processing circuitry 106.

The bypass circuitry 105 also includes logic modules 206 in the form of an AND gates. Each logic module 206 has a sensitizing input 207 coupled to the bypass controller 104, a selective input 208 coupled to the bypass input 202 and a logic module output 209 coupled to one or more of the circuit modules 107. As shown, the sensitizing input 207 is coupled to the control input 204 of a respective multiplexer 201. Hence, in operation when the multiplexer output 205 is selectively coupled to the bypass input 202, the logic module output 209 is de-coupled from the bypass input 202. For instance, assuming logic 0 is supplied from the bypass controller 104 to the control input 204 of the multiplexers 201 to couple the multiplexer output 205 to the bypass input 202, this will result in the logic module output 209 being de-sensitized from the selective input 208. This is because the logic module output 209 will remain at logic 0 regardless of any signal applied at the selective input 208.

In contrast to the above, when the multiplexer output 205 is selectively coupled to the processing circuitry input 203, the logic module output 209 is coupled (sensitized) to the bypass input 202. For instance, assuming logic 1 is supplied from the bypass controller 104 to the control input 204 of the multiplexers 201 to de-couple the multiplexer output 205 from the bypass input 202 and couple the processing circuitry input 203 to the multiplexer output 205. This therefore results in the logic module output 209 being sensitized to the selective input 208 because the signal at the logic module output 209 will be the same as the signal applied at the selective input 208.

In operation, the bypass controller 104 provides the signal Si to the control node 120, or alternatively this signal Si may be provided directly from a bypass control node 121). This signal Si controls the bypass circuitry 105 to selectively couple at least one pair of the integrated circuit interface terminals together 101. This pair 102, 103 is one of the circuit input terminals 102 and one of the circuit output terminals 103. Also, in one embodiment, when the pair of the integrated circuit interface terminals 102, 103 are coupled together, one or more of the circuit modules 107 are selectively de-coupled from the pair of the integrated circuit terminals 102, 103.

Figure 3:
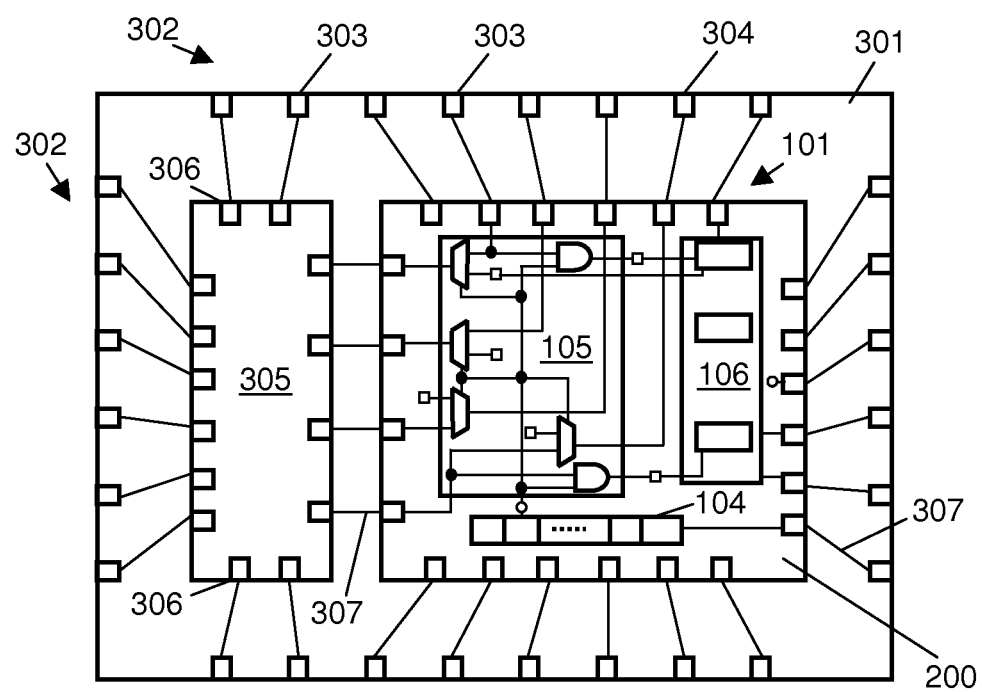
FIG. 3 is a schematic circuit diagram of a semiconductor package in accordance with a third preferred embodiment of the present invention.

Referring to FIG. 3 there is illustrated a schematic circuit diagram of a semiconductor package 300 in accordance with a third preferred embodiment of the present invention. The semiconductor package 300 includes the reconfigurable integrated circuit 200 (formed in a second semiconductor die) mounted on a substrate 301. There are external package terminals 302 supported by the substrate 301, the terminals 302 comprise package input terminals 303 and package output terminals 304. A first semiconductor die 305 is mounted on the substrate 301 and the first semiconductor die 305 has first die external terminals 306. There are electrical connections 307 selectively connecting the external package terminals 302 to the first die external terminals 306 and the integrated circuit interface terminals 101. The electrical connections 307 are typically runners on the substrate 301. However they could also be wire bonds or any other form of electrical connection means. The electrical connections 307 also provide for selectively connecting the first die external terminals 306 to the integrated circuit interface terminals 101.

In operation, the bypass controller 104 controls the bypass circuitry 105 to thereby selectively couple at least one of the external package terminals 302 to at least one of the first die external terminals 306 through the bypass circuitry 105. As a result, one or more of the external package terminals 302 and one or more of the first die external terminals 306 are allowed to communicate with each other via the bypass circuitry 105. It will therefore be apparent to a person skilled in the art that selected external package terminals 302 can either communicate with the first die 305 via the bypass circuitry 105 or alternatively send and receive signals through the processing circuitry of the integrated circuit 200.

Figure 4:
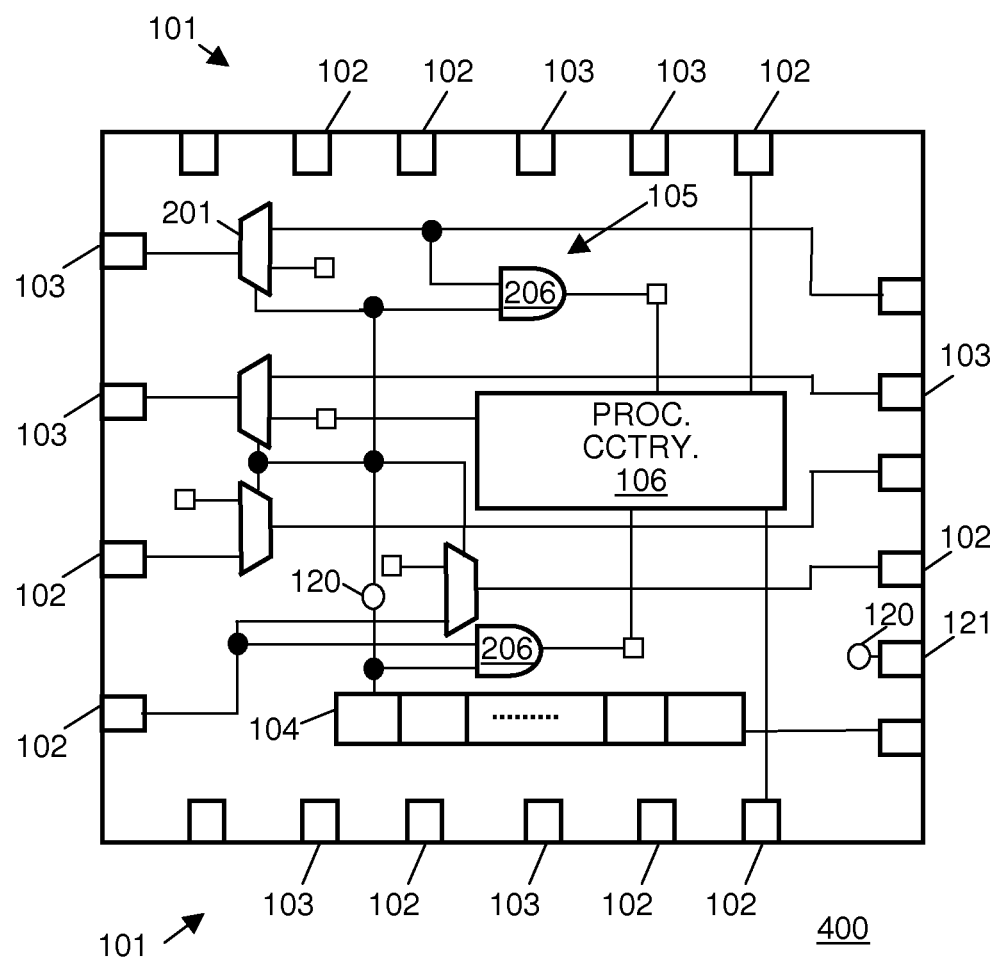
FIG. 4 is a schematic circuit diagram of a reconfigurable integrated circuit with bypass circuitry configured in accordance with a fourth preferred embodiment of the present invention.

Referring to FIG. 4 there is illustrated a schematic circuit diagram of a reconfigurable integrated circuit 400 with bypass circuitry 105 configured in accordance with a fourth preferred embodiment of the present invention. The functionality and operation of the reconfigurable integrated circuit 400 is identical to that of the reconfigurable integrated circuit 200, with the exception that the bypass circuitry 105 is connected to different integrated circuit interface terminals 101, and therefore to avoid repetition no further description is provided.

Figure 5:
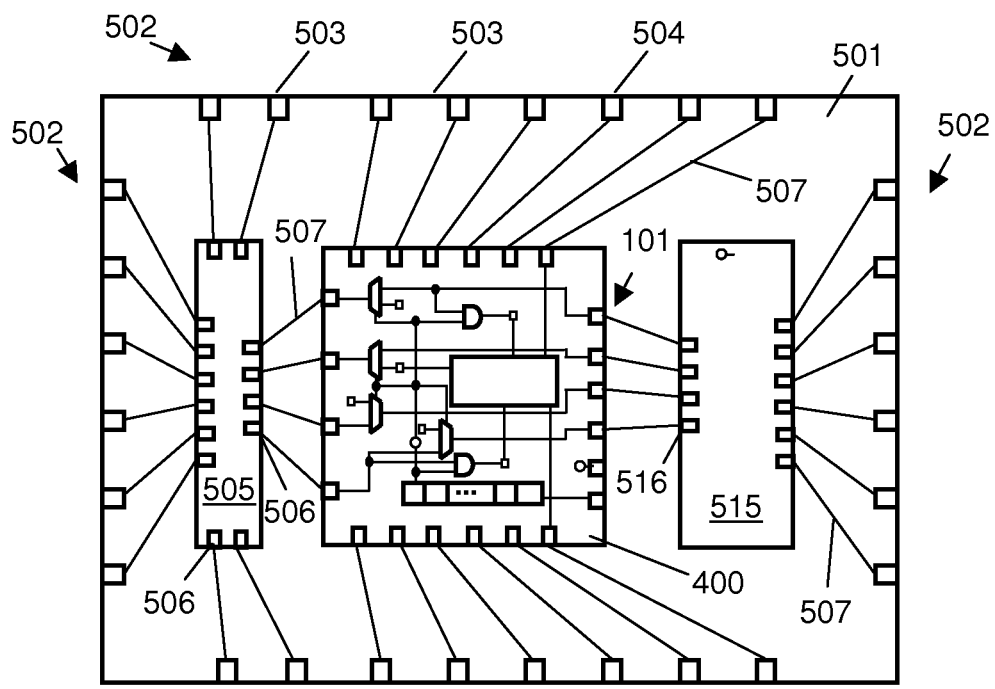
FIG. 5 is a schematic circuit diagram of a semiconductor package in accordance with a fifth preferred embodiment of the present invention.

Referring to FIG. 5 there is illustrated a schematic circuit diagram of a semiconductor package 500 in accordance with a fifth preferred embodiment of the present invention. The semiconductor package 500 includes the reconfigurable integrated circuit 400 (formed in a second semiconductor die) mounted on a substrate 501. There are external package terminals 502 supported by the substrate 501, the terminals 502 comprise package input terminals 503 and package output terminals 504. A first semiconductor die 505 is mounted on the substrate 501 and the first semiconductor die 505 has first die external terminals 506. There are electrical connections 507 selectively connecting the external package terminals 502 to the first die external terminals 506 and the integrated circuit interface terminals 101. The electrical connections 507 are typically runners on the substrate 501, however, they could also be wire bonds or any other form of electrical connection means. The electrical connections 507 also provide for selectively connecting the first die external terminals 506 to the integrated circuit interface terminals 101.

There is a third semiconductor die 515 mounted on the substrate 501. The third semiconductor die 515 has third die external terminals 516 and the electrical connections 507 provide for selectively connecting the external package terminals 502 to the third die external terminals 516 and the integrated circuit interface terminals 101.

In operation the bypass controller 104 controls the bypass circuitry 105 to thereby selectively couple at least one of the third die external terminals 516 to at least one of the first die external terminals 506 through the bypass circuitry 105. It will therefore be apparent to a person skilled in the art that selected first die external terminals 506 can communicate with selected second die terminals 516 via the bypass circuitry 105 or alternatively send or receive signals through the processing circuitry of the reconfigurable integrated circuit 400.

Figure 6:
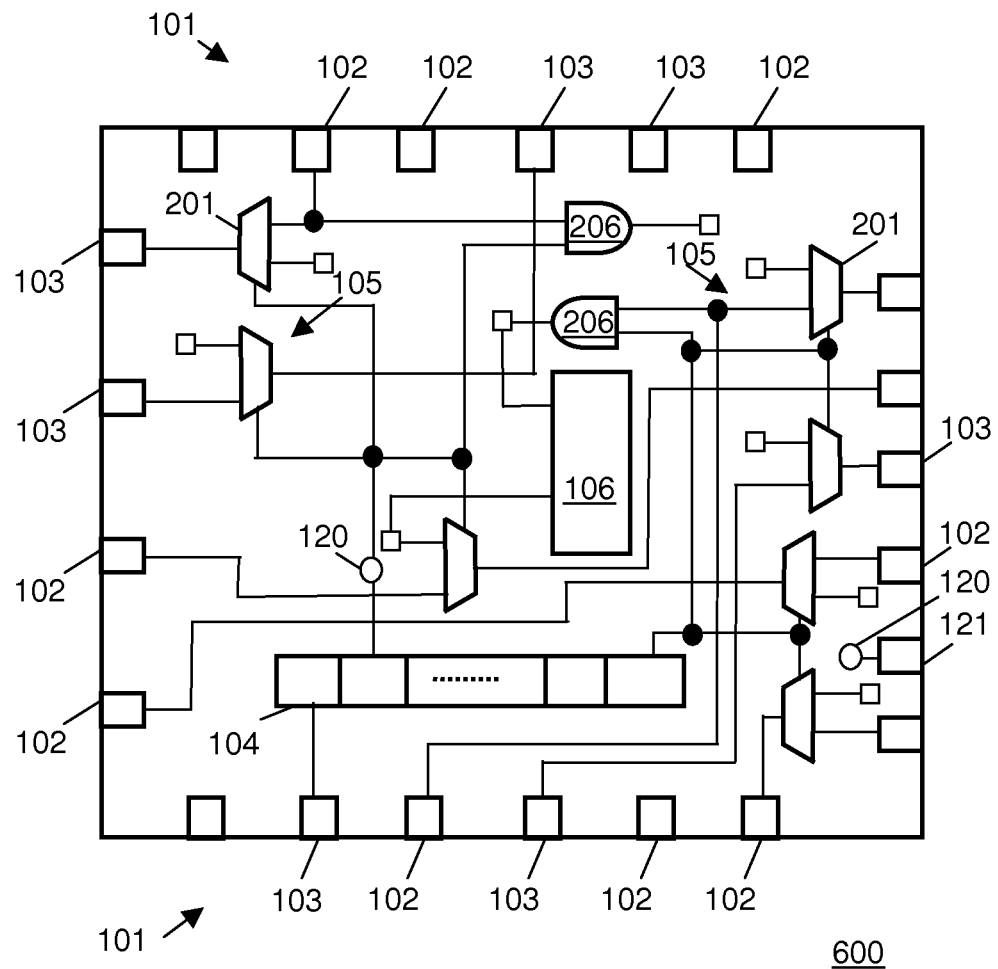
FIG. 6 is a schematic circuit diagram of a reconfigurable integrated circuit with bypass circuitry configured in accordance with a sixth preferred embodiment of the present invention.

FIG. 6 is a schematic circuit diagram of a reconfigurable integrated circuit 600 with bypass circuitry 105 configured in accordance with a sixth preferred embodiment of the present invention. The functionality and operation of the reconfigurable integrated circuit 600 is identical to that of the reconfigurable integrated circuit 200, with the exception that the bypass circuitry 105 is connected to different integrated circuit interface terminals 101, and therefore to avoid repetition no further description is provided.

Figure 7:
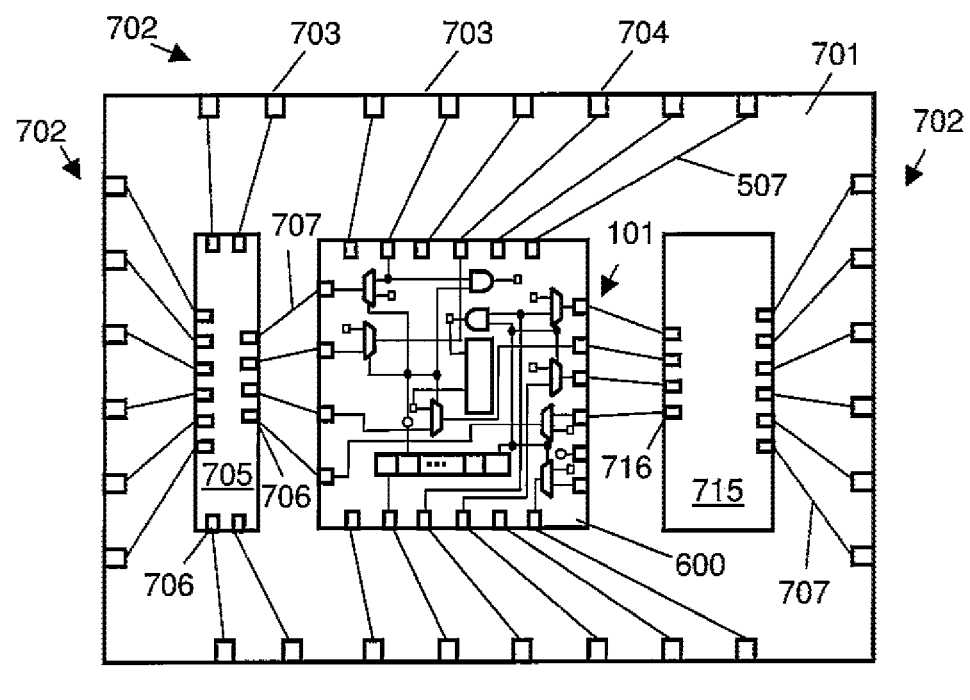
FIG. 7 is a schematic circuit diagram of a semiconductor package in accordance with a seventh preferred embodiment of the present invention.

FIG. 7 is a schematic circuit diagram of a semiconductor package 700 in accordance with a seventh preferred embodiment of the present invention. The semiconductor package 700 includes the reconfigurable integrated circuit 600 (formed in a second semiconductor die) mounted on a substrate 701. There are external package terminals 702 supported by the substrate 701, the terminals 702 comprise package input terminals 703 and package output terminals 704. A first semiconductor die 705 is mounted on the substrate 701 and the first semiconductor die 705 has first die external terminals 706. There are electrical connections 707 selectively connecting the external package terminals 702 to the first die external terminals 706 and the integrated circuit interface terminals 101. The electrical connections 707 are typically runners on the substrate 701. However they could also be wire bonds or any other form of electrical connection means. The electrical connections 707 also provide for selectively connecting the first die external terminals 706 to the integrated circuit interface terminals 101.

A third semiconductor die 715 is mounted on the substrate 701. The third semiconductor die 715 has third die external terminals 716 and the electrical connections 707 provide for selectively connecting the external package terminals 702 to the third die external terminals 716 and the integrated circuit interface terminals 101.

In operation, the bypass controller 104 controls the bypass circuitry 105 to thereby selectively couple at least one of the external package terminals 702 to at least one of the first die external terminals 706 through the bypass circuitry 105. As a result, one or more of the external package terminals 702 and one or more of the first die external terminals 706 are allowed to communicate with each other via the bypass circuitry 105. Also, in operation the bypass controller 104 controls the bypass circuitry 105 to thereby selectively couple at least one of the third die external terminals 716 to at least one of the first die external terminals 706 through the bypass circuitry 105. Thus, selected first die external terminals 706 can communicate with selected second die terminals 716 via the bypass circuitry 105 or alternatively send or receive signals through the processing circuitry of the reconfigurable integrated circuit 600. Furthermore, selected external package terminals 702 can either communicate with the first die 705 via the bypass circuitry 105 or alternatively send and receive signals through the processing circuitry of the reconfigurable integrated circuit 600. As will be apparent to a person skilled in the art, in one embodiment, the bypass controller controls 104 controls the bypass circuitry 105 to selectively couple at least one pair of the integrated circuit interface terminals 101 together.

When the bypass controller 104 is a programmable register then in operation a first state of the programmable register controls the bypass circuitry 105 to couple at least one the first die external terminals (706 or 707) to at least of one external package terminals 702 through the at least one pair of the integrated circuit interface terminals, and wherein a second state of the programmable register controls the bypass circuitry 105 to couple at least one of the first die external terminals (706 or 707) to at least one circuit modules 107 through the at least one pair of the integrated circuit interface terminals 101. The bypass circuitry 105 can also perform similar connectivity between the third semiconductor die 715 as will be apparent to a person skilled in the art.

Figure 8:
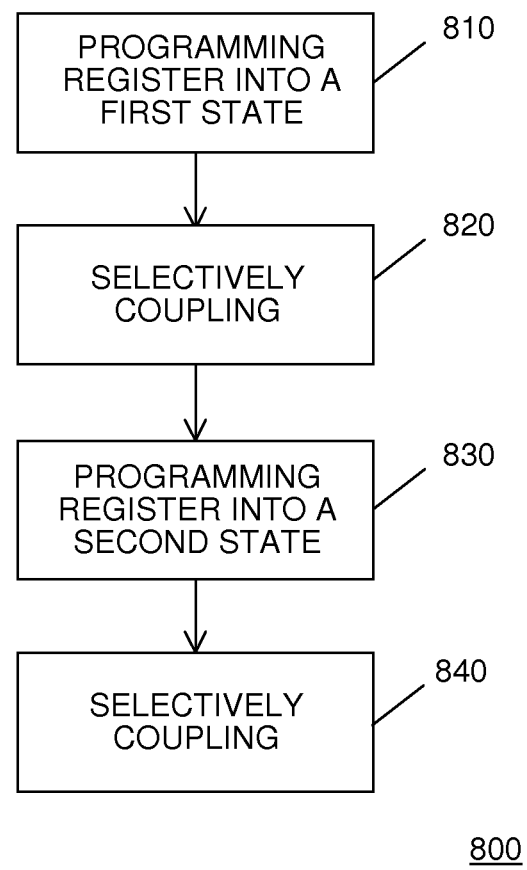
FIG. 8 is a flow chart illustrating a method for reconfiguring the reconfigurable integrated circuit of FIG. 1 in accordance with a preferred embodiment of the present invention.

Referring to FIG. 8 a flow chart of a method 800 for reconfiguring the reconfigurable integrated circuit 100 in accordance with a preferred embodiment of the present invention is shown. The method 800 includes, at a programming block 810, a process of programming the programmable register 104 into a first state (State1) to provide a first state signal S1 to the bypass circuitry 105. This is typically achieved by sequentially clocking a binary code into the programmable register 104, for instance if the programmable register 104 is an 8-bit register then 8 clock cycles would be required to clock the first state (State1) into the programmable register 104. Since there are 64 possible states of the programmable register 104, there are (if required) 64 potential configurations for the bypass circuitry 105. As will be apparent to a person skilled in the art, the programming of the programmable register 104 can be performed by direct access from the integrated circuit interface terminals 101, or by indirect access from also processing circuitry 106 or by a combination of both direct and indirect access.

At a selectively coupling block 820, the method 800 performs selectively coupling at least one pair of the integrated circuit interface terminals 101 together through the bypass circuitry 106 in response to the first state signal S1, the pair of integrated circuit interface terminals 101 comprises one of the circuit input terminals 102 and one of the circuit output terminals 103. The method 800, at a programming block 830, then performs programming the programmable register 104 into a second state (State2) to provide a second state signal S2 to the bypass circuitry 105.

At a selectively coupling block 840, the method 800 then provides for selectively coupling at least one of the integrated circuit interface terminals 101 to at least one of the circuit modules 107 through the bypass circuitry 105 in response to the second state signal S2. As will be apparent to a person skilled in the art, if required, further procedures of programming the programmable register 104 into any one of the possible 64 states (for a six bit register) can be performed to configure the bypass circuitry 105 for different bypass and non-bypass functions. However, the number of usable states is typically dependent on the functionality and number of multiplexers included in the bypass circuitry 105.

Advantageously, the present invention provides for improved or an alternative accessibility route for testing specific terminals and associated circuitry of one or more of the dies in a semiconductor package. The present invention is also suitable for potentially increasing the functionality of a semiconductor package by reconfiguring the integrated circuit 100 as will be apparent to a person skilled in the art.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. For example, the AND gates forming the logic modules 206 could be replaced with NAND gates so long as the multiplexers were configured accordingly to function appropriately and complementary to the functionality of the NAND gates. As another example the word "terminals" referenced in this invention can be interpreted as one of integrated circuit interface terminals 101, semiconductor input/output pads, package pins, leads or connections. It is understood, therefore, that this invention is not limited to the particular embodiment disclosed, but covers modifications within the spirit and scope of the present invention as defined by the appended claims.

The invention claimed is:

1. A reconfigurable integrated circuit, comprising:
   integrated circuit interface terminals including circuit input terminals and circuit output terminals;
   at least one bypass control node;
   bypass circuitry coupled to the bypass control node, at least one of the circuit input terminals and at least one of the circuit output terminals, wherein the bypass circuitry comprises at least one multiplexer with a bypass input, a processing circuitry input, a control input coupled to the bypass control node, and a multiplexer output; and
   processing circuitry comprising a plurality of circuit modules coupled to the bypass circuitry, wherein the processing circuitry is coupled to at least one of the circuit input terminals and at least one of the circuit output terminals, wherein the bypass circuitry further comprises a logic module having a sensitizing input coupled to the bypass control node, a selective input coupled to the bypass input, and a logic module output coupled to at least one of the circuit modules,
   wherein in operation a signal at the bypass control node controls the bypass circuitry to selectively couple at least one pair of the integrated circuit interface terminals together by selectively coupling the multiplexer output to at least one of the bypass input and the processing circuitry input, the pair comprising one of the circuit input terminals and one of the circuit output terminals.

2. The reconfigurable integrated circuit of claim 1, wherein when the pair of the integrated circuit interface terminals is coupled together, at least one of the circuit modules is selectively de-coupled from the pair of the integrated circuit interface terminals.

3. The reconfigurable integrated circuit of claim 1, wherein in operation a signal at the bypass control node controls the control input to selectively couple the multiplexer output to at least one of the bypass input and the processing circuitry input.

4. The reconfigurable integrated circuit of claim 3, wherein the sensitizing input is coupled to the control input, and wherein in operation, when the multiplexer output is selectively coupled to the bypass input the logic module output is de-coupled from the bypass input.

5. The reconfigurable integrated circuit of claim 4, wherein in operation when the multiplexer output is selectively coupled to the processing circuitry input the logic module output is coupled to the bypass input.

6. The reconfigurable integrated circuit of claim 3, wherein the bypass input is coupled to one of the circuit input terminals, the multiplexer output is coupled to one of the circuit output terminals, and the processing circuitry input is coupled to the processing circuitry.

7. The reconfigurable integrated circuit of claim 6, wherein the bypass control node is coupled to an output of a programmable register.

8. A semiconductor package, comprising:
   a substrate;
   external package terminals supported by the substrate, the terminals comprising package input terminals and package output terminals;
   a first semiconductor die mounted on the substrate, the first semiconductor die having first die external terminals;
   a second semiconductor die mounted on the substrate, wherein the second semiconductor die is a reconfigurable integrated circuit comprising:
      integrated circuit interface terminals comprising circuit input terminals and circuit output terminals;
      a bypass controller;
      bypass circuitry coupled to the bypass controller, at least one of the circuit input terminals and at least one of the circuit output terminals, wherein the bypass circuitry comprises at least one multiplexer with a bypass input, a processing circuitry input, a control input coupled to the bypass controller, and a multiplexer output; and
      processing circuitry comprising a plurality of circuit modules coupled to the bypass circuitry, the processing circuitry being coupled to at least one of the circuit input terminals and at least one of the circuit output terminals, wherein the bypass circuitry further comprises a logic module having a sensitizing input coupled to the bypass controller, a selective input coupled to the bypass input and a logic module output coupled to at least one of the circuit modules,
      wherein in operation the bypass controller controls the bypass circuitry to selectively couple at least one pair of the integrated circuit interface terminals together, the pair comprising one of the circuit input terminals and one of the circuit output terminals; and
   electrical connections selectively connecting the external package terminals to the first die external terminals and the integrated circuit interface terminals, and wherein the electrical connections also allow for selectively connecting the first die external terminals to the integrated circuit interface terminals.

9. The semiconductor package of claim 8, wherein when the pair of the integrated circuit interface terminals is coupled together, at least one of the circuit modules is selectively de-coupled from the pair of the integrated circuit interface terminals.

10. The semiconductor package of claim 8, wherein in operation the bypass controller provides a signal to the control input to selectively couple the multiplexer output to either the bypass input or the processing circuitry input.

11. The semiconductor package of claim 10, wherein the sensitizing input is coupled to the control input and wherein in operation when the multiplexer output is selectively coupled to the bypass input the logic module output is de-coupled from the bypass input.

12. The semiconductor package of claim 11, wherein in operation when the multiplexer output is selectively coupled to the processing circuitry input, the logic module output is coupled to the bypass input.

13. The semiconductor package of claim 8, wherein the bypass input is coupled to one of the circuit input terminals, and the multiplexer output is coupled to one of the circuit output terminals.

14. The semiconductor package of claim 8, wherein in operation the bypass controller controls the bypass circuitry to selectively couple at least one of the external package terminals to at least one of the first die external terminals by way of the bypass circuitry.

15. The semiconductor package of claim 8, further comprising a third semiconductor die mounted on the substrate, the third semiconductor die having third die external terminals, wherein the electrical connections selectively connect the external package terminals to the third die external terminals and the integrated circuit interface terminals.

16. The semiconductor package of claim 15, wherein in operation the bypass controller controls the bypass circuitry to selectively couple at least one of the third die external terminals to at least one of the first die external terminals by way of the bypass circuitry, and wherein in operation the reconfigurable integrated circuit, the first semiconductor die, and the third semiconductor die concurrently communicate with the external package terminals by way of the bypass circuitry.

17. The semiconductor package of claim 8, wherein the bypass controller is a programmable register and in operation a first state of the programmable register controls the bypass circuitry to couple at least one the first die external terminals to at least one of the external package terminals through the at least one pair of the integrated circuit interface terminals, and wherein a second state of the programmable register controls the bypass circuitry to couple at least one of the first die external terminals to at least one of the circuit modules through the at least one pair of the integrated circuit interface terminals.

18. A method for reconfiguring a reconfigurable integrated circuit with integrated circuit interface terminals comprising circuit input terminals and circuit output terminals, the reconfigurable integrated circuit comprising at least one programmable register, bypass circuitry coupled to the programmable register, at least one of the circuit input terminals and at least one of the circuit output terminals, processing circuitry comprising a plurality of circuit modules coupled to the bypass circuitry, the processing circuitry being coupled to at least one of the circuit input terminals and at least one of the circuit output terminals, wherein the method includes:

programming the programmable register into a first state to provide a first state signal to the bypass circuitry;

selectively coupling at least one pair of the integrated circuit interface terminals together through the bypass circuitry in response to the first state signal, the pair of integrated circuit interface terminals comprising one of the circuit input terminals and one of the circuit output terminals;

programming the programmable register into a second state to provide a second state signal to the bypass circuitry; and selectively coupling at least one of the integrated circuit interface terminals to at least one of the circuit modules, through the bypass circuitry, in response to the second state signal.

\* \* \* \* \*